(12) United States Patent
Kim

(10) Patent No.: US 9,497,860 B2
(45) Date of Patent: Nov. 15, 2016

(54) METHODS AND APPARATUSES TO PROVIDE AN ELECTRO-OPTICAL ALIGNMENT

(71) Applicant: Lattice Semiconductor Corporation, Portland, OR (US)

(72) Inventor: Kihong Kim, Cupertino, CA (US)

(73) Assignee: LATTICE SEMICONDUCTOR CORPORATION, Portland, OR (US)

(*) Notice: Subject to any disclaimer, the term of this patent is extended or adjusted under 35 U.S.C. 154(b) by 0 days.

(21) Appl. No.: 13/671,527

(22) Filed: Nov. 7, 2012

(65) Prior Publication Data

US 2014/0126863 A1   May 8, 2014

(51) Int. Cl.
| | |
|---|---|
| *G02B 6/42* | (2006.01) |
| *H05K 1/11* | (2006.01) |
| *H05K 3/36* | (2006.01) |
| *H05K 3/40* | (2006.01) |
| *G02B 6/43* | (2006.01) |
| *H05K 1/02* | (2006.01) |
| *H05K 1/14* | (2006.01) |

(52) U.S. Cl.
CPC ............. *H05K 1/117* (2013.01); *G02B 6/42* (2013.01); *H05K 3/366* (2013.01); *H05K 3/403* (2013.01); *G02B 6/4214* (2013.01); *G02B 6/4246* (2013.01); *G02B 6/4292* (2013.01); *G02B 6/43* (2013.01); *H05K 1/0274* (2013.01); *H05K 1/141* (2013.01); *H05K 2201/09072* (2013.01); *H05K 2201/09145* (2013.01); *H05K 2201/10121* (2013.01); *Y10T 29/4913* (2015.01)

(58) Field of Classification Search
USPC ......................................... 385/88–94
See application file for complete search history.

(56) References Cited

U.S. PATENT DOCUMENTS

| | | | | |
|---|---|---|---|---|
| 5,768,456 | A | * | 6/1998 | Knapp et al. ................ 385/49 |
| 5,774,614 | A | * | 6/1998 | Gilliland et al. ............ 385/88 |
| 5,812,717 | A | * | 9/1998 | Gilliland ..................... 385/93 |
| 5,815,623 | A | * | 9/1998 | Gilliland et al. ............ 385/93 |
| 6,040,624 | A | * | 3/2000 | Chambers et al. .......... 257/692 |
| 6,799,902 | B2 | | 10/2004 | Anderson et al. |
| 7,045,824 | B2 | | 5/2006 | Malone et al. |
| 2002/0196500 | A1 | | 12/2002 | Cohen et al. |
| 2003/0026081 | A1 | * | 2/2003 | Liu et al. ..................... 361/760 |
| 2003/0031424 | A1 | | 2/2003 | Ohbayashi et al. |
| 2004/0223703 | A1 | | 11/2004 | Miyamae et al. |

(Continued)

OTHER PUBLICATIONS

Extended European Search Report, European Application No. 13870098.4, Jul. 1, 2016, 7 pages.

(Continued)

*Primary Examiner* — Thomas A Hollweg
*Assistant Examiner* — Mary A El Shammaa
(74) *Attorney, Agent, or Firm* — Fenwick & West LLP

(57) ABSTRACT

Exemplary embodiments of methods and apparatuses to provide an electro-optical alignment are described. An electrical connector is formed on a printed circuit board substrate that extends onto a side surface of the substrate to form an electrical turn. An optoelectronic die is placed onto the printed circuit board substrate. The optoelectronic die on the printed circuit board substrate is erected over a mounting board to provide optical coupling substantially parallel to the mounting board.

20 Claims, 16 Drawing Sheets

(56) References Cited

U.S. PATENT DOCUMENTS

| | | | |
|---|---|---|---|
| 2006/0008214 A1* | 1/2006 | Giboney et al. | 385/92 |
| 2006/0028926 A1* | 2/2006 | Terada et al. | 369/13.17 |
| 2006/0110110 A1 | 5/2006 | Yi et al. | |
| 2009/0003763 A1* | 1/2009 | Mohammed | H01L 31/0203 385/14 |
| 2010/0215312 A1 | 8/2010 | Daikuhara et al. | |
| 2010/0272402 A1* | 10/2010 | Fukui | G02B 6/4201 385/88 |
| 2010/0322551 A1 | 12/2010 | Budd et al. | |
| 2011/0311182 A1 | 12/2011 | Meadowcroft et al. | |
| 2012/0057822 A1 | 3/2012 | Wu et al. | |
| 2012/0063785 A1* | 3/2012 | Yagisawa | G02B 6/4246 398/116 |
| 2012/0241795 A1* | 9/2012 | Chang | G02B 6/4201 257/98 |

OTHER PUBLICATIONS

PCT International Search Report and Written Opinion, PCT Application No. PCT/US2013/065433, Jul. 30, 2014, 12 pages.

* cited by examiner

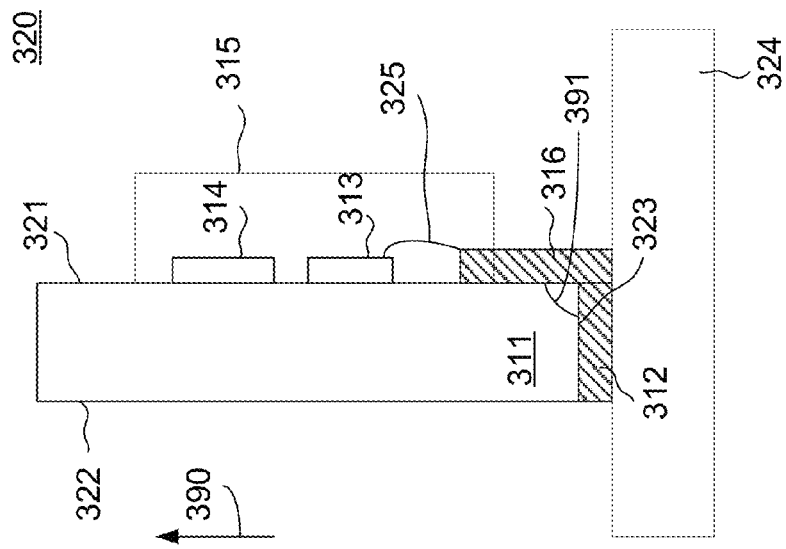
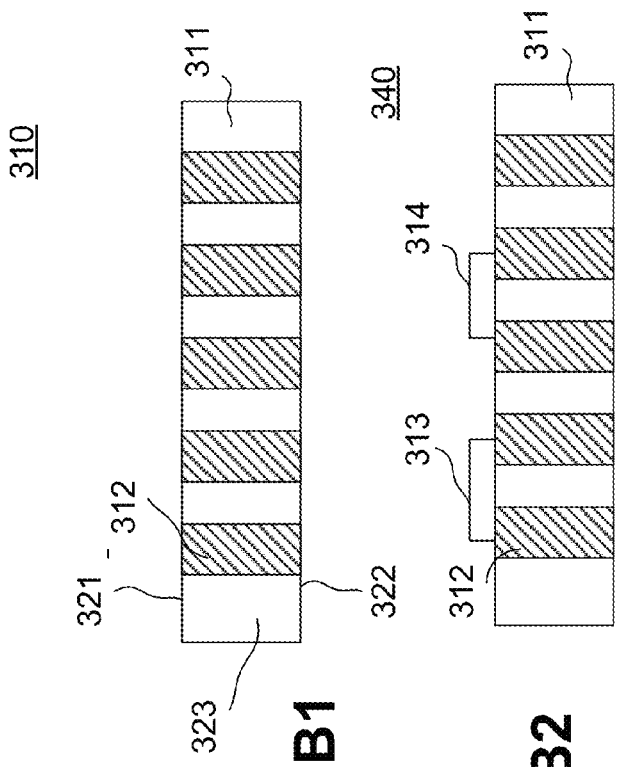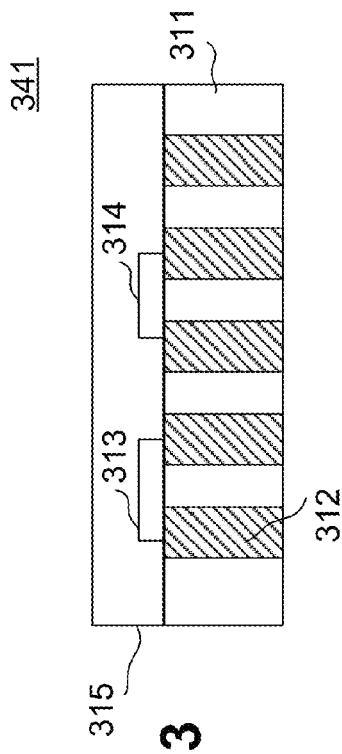
Fig. 3B1　　Fig. 3B2　　Fig. 3B3　　Fig. 3C

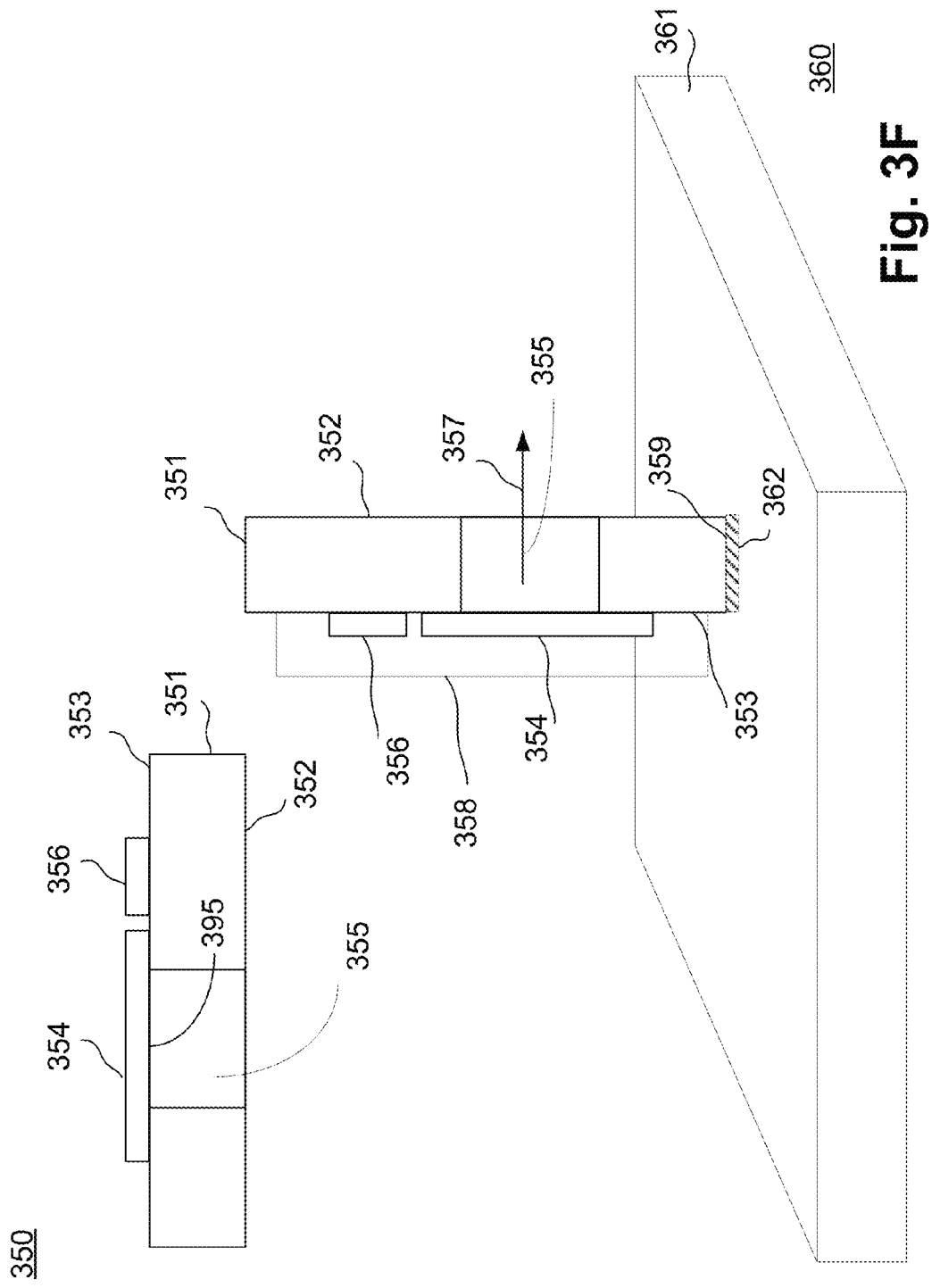

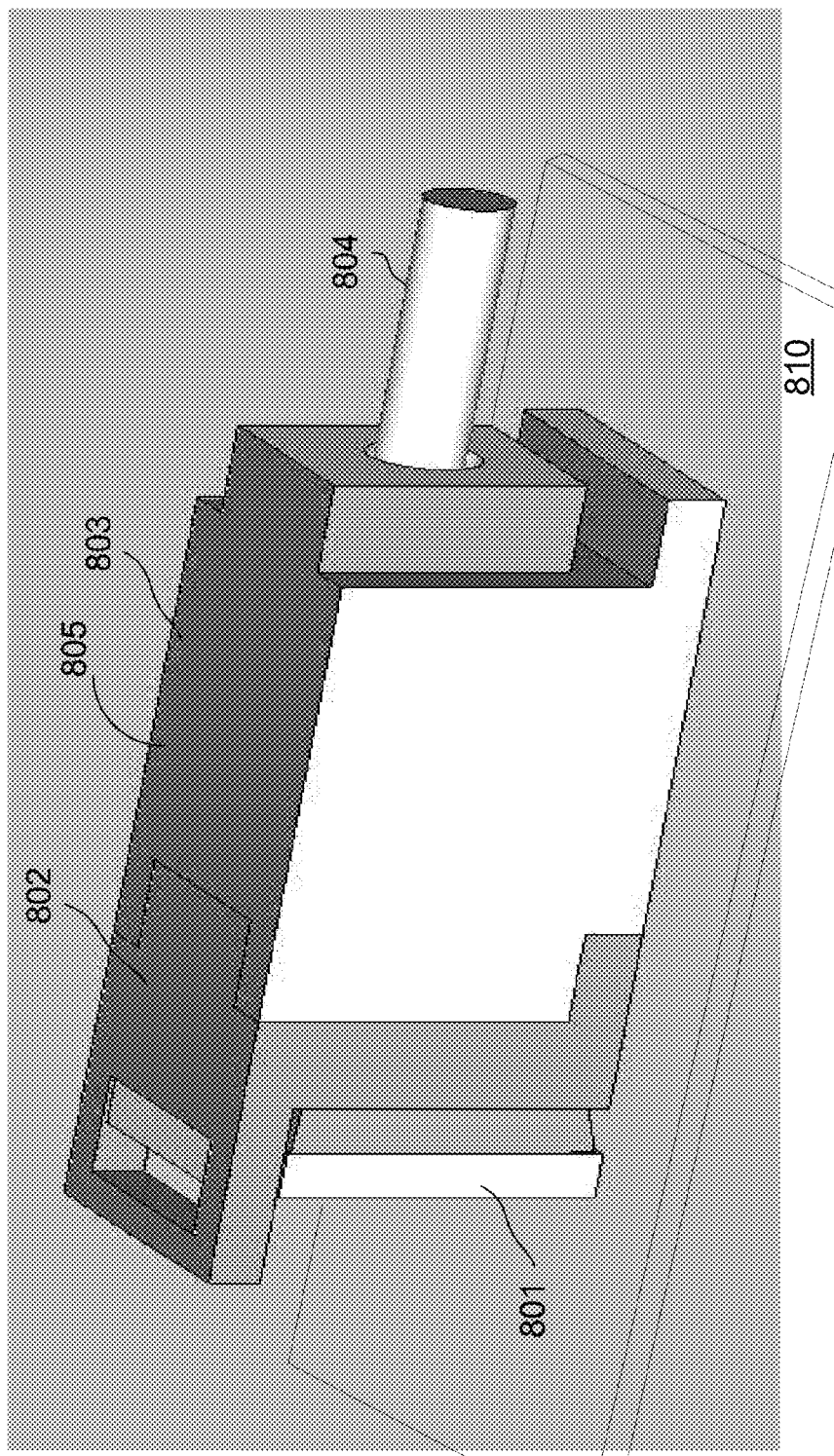

METHODS AND APPARATUSES TO PROVIDE AN ELECTRO-OPTICAL ALIGNMENT

FIELD

At least some embodiments of the present invention generally relate to optoelectronic device manufacturing, and more particularly, to providing an electro-optical alignment.

BACKGROUND

Surface emitting light sources, such as Vertical Cavity Surface Emitting Lasers (VCSELs), typically have a light emitting area that is larger than the light emitting area of edge emitting laser diodes. Generally, VCSELs provide a cost effective solution for an optical telecommunication industry.

In consumer electronics industry, however, a lot need to be saved to meet its cost requirement. For example, packaging requirements for VCSELs integrated into consumer electronics (CE) devices, such as smart mobile devices are different from the packaging requirements for the VCSELs used in the telecommunication industry. Typically, the overall package size for CE devices reduces that requires further optimization to fit into a small form factor.

FIG. 1 illustrates a typical surface emitting (SE) laser device packaging 100. As shown in FIG. 1, a SE laser device 103 on a substrate 102 is placed on a mounting board 101. SE device 103 emits light in a direction 104 away from the board 103. To integrate the SE laser 103 into the package, a ray optics lens system 106 including a prism and a lens is used. As shown in FIG. 1, optical system 106 is mounted over the laser device 103 to form about 90 degree angle bending 105 of the light to couple to a fiber 107.

That is, the current packaging solution uses a 90 degree bending light-pipe with a ray optic lens system to integrate a surface emitting (SE) laser device into a thin mobile device's package. This solution requires an expensive ray optic lens system design and manufacturing. Moreover, after the manufacturing, the current packaging solution requires a high cost precision alignment assembly.

SUMMARY OF THE DESCRIPTION

Exemplary embodiments of methods and apparatuses to provide an electro-optical alignment are described. In at least some embodiments, an electrical connector is formed on a printed circuit board substrate that extends onto a side surface of the substrate to form a turn. An optoelectronic die is placed onto the printed circuit board substrate. The optoelectronic die on the printed circuit board substrate is erected over a mounting board to provide optically coupling substantially parallel to the mounting board. The electrical connector extended to the second surface of the printed circuit board substrate is placed onto the mounting board to replace an optical path turn for coupling of the optoelectronic die by the electrical connector turn.

Other features of the present invention will be apparent from the accompanying drawings and from the detailed description which follows.

BRIEF DESCRIPTION OF DRAWINGS

The embodiments as described herein are illustrated by way of example and not limitation in the figures of the accompanying drawings in which like references indicate similar elements.

FIG. 3B1 shows a side view of a finished micro sub-assembly substrate to form a micro sub-assembly according to one embodiment of the invention.

FIG. 3B2 is a view similar to FIG. 3B 1 after an optoelectronic device is placed onto a predefined place on the substrate according to one embodiment of the invention.

FIG. 3B3 is a view similar to FIG. 3B2 after a protection cover is formed over the optoelectronic device according to one embodiment of the invention.

FIG. 3C is a view similar to FIG. 3B3, after an optoelectronic device on the surface of the sub-assembly substrate is erected over a mounting board according to one embodiment of the invention.

FIG. 3E shows a cross-sectional view of a micro optical sub-assembly (MOSA) according to one embodiment of the invention.

FIG. 3F is a side view similar to FIG. 3E, after the optoelectronic device on the substrate is erected over a mounting board according to one embodiment of the invention.

FIG. 8B is a perspective top view of the assembly of FIG. 8A on a mounting board according to one embodiment of the invention.

DETAILED DESCRIPTION

Figure 1:
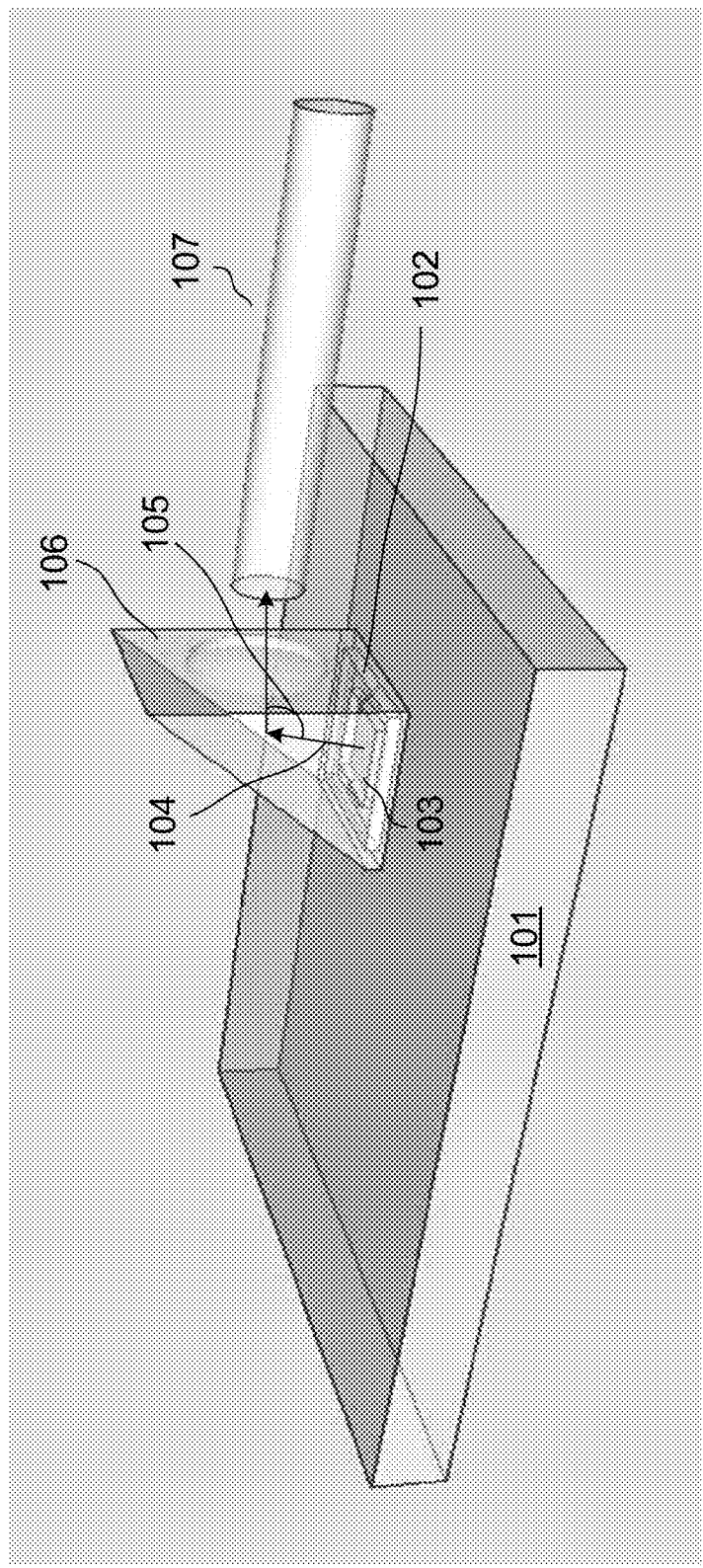
FIG. 1 illustrates a typical surface emitting (SE) laser device packaging.

Exemplary embodiments of methods and apparatuses to provide an electro-optical alignment are described. Exemplary embodiments described herein address a low cost and a small form factor optoelectronic device packaging for a consumer electronics (CE) application. Exemplary embodiments described herein provide a low cost, simplified optical alignment using standard building blocks for example, for high bit rate optical connectivity links, thin optical cables, light weight optical cables, consumer optics, consumer electronics, consumer electro-optics, and nonhermetic packaging.

In at least some embodiments, an electrical connector is formed on a printed circuit board substrate that extends onto a side surface of the substrate to form a turn at a predetermined angle. An optoelectronic die is placed onto the printed circuit board substrate. The optoelectronic die on the printed circuit board substrate is erected over a mounting board to provide optically coupling substantially parallel to the mounting board. The electrical connector extended to the side surface of the printed circuit board substrate is placed onto the mounting board to replace an optical path turn for coupling of the optoelectronic die by the electrical connector turn.

In at least some embodiments, a micro optical subassembly (MOSA) including at least one of a surface emitting laser (e.g., VCSEL) and a photodetector is placed on a vertical substrate to facilitate a fiber assembly without using a 90 degree ("right angle") light-pipe bending that includes an optical spacer and a lens holder with a fiber holder as separate pieces with an optional optical collimator embedment. In one embodiment, the MOSA as described herein enables low cost, small footprint (e.g. less than around 3×5 mm) active optical cable (AOC) building block for consumer electro-optic components and application. Removing the right-angle turn of the optical axis provides an advantage as it increases the optical alignment precision tolerance by at least 10 times (e.g., from 10 µm to 100 µm) and saves most of cost for optical subassembly for transmitter and receiver.

In at least some embodiments, an optoelectronic device (e.g., VCSEL, other SE device, a photodetector) is surface mounted onto a typical substrate material of a printed circuit board (PCB). An electrode is formed on an edge of the substrate to operate the optoelectronic device. In at least some embodiments, a plastic cover is formed over the optoelectronic device to hold the substrate in an erected shape on a motherboard or secondary module for a higher-level function, for example, high-speed SERDES (Serializer/Deserializer) for Mobile High Definition Link (MHL), High-definition Multimedia Link (HDMI), Peripheral Component Interconnect Express (PCIE), Universal Serial Bus (USB), Thunderbolt, SATA, and other function.

Generally, the SerDes refers to a pair of functional blocks commonly used in high speed communications to compensate for limited input/output. These blocks convert data between serial data and parallel interfaces in each direction. The Thunderbolt generally refers to an interface for connecting peripheral devices to a computer via an expansion bus, the SATA refers a computer bus interface for connecting host bus adapters to mass storage devices e.g., hard disk drives and optical drives.

In the following description, numerous specific details, such as specific materials, dimensions of the elements, etc. are set forth in order to provide thorough understanding of one or more of the embodiments as described herein. It will be apparent, however, to one of ordinary skill in the art that the one or more embodiments as described herein may be practiced without these specific details. In other instances, semiconductor fabrication processes, techniques, materials, equipment, etc., have not been described in great detail to avoid unnecessary obscuring of this description.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "one embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

Figure 2:
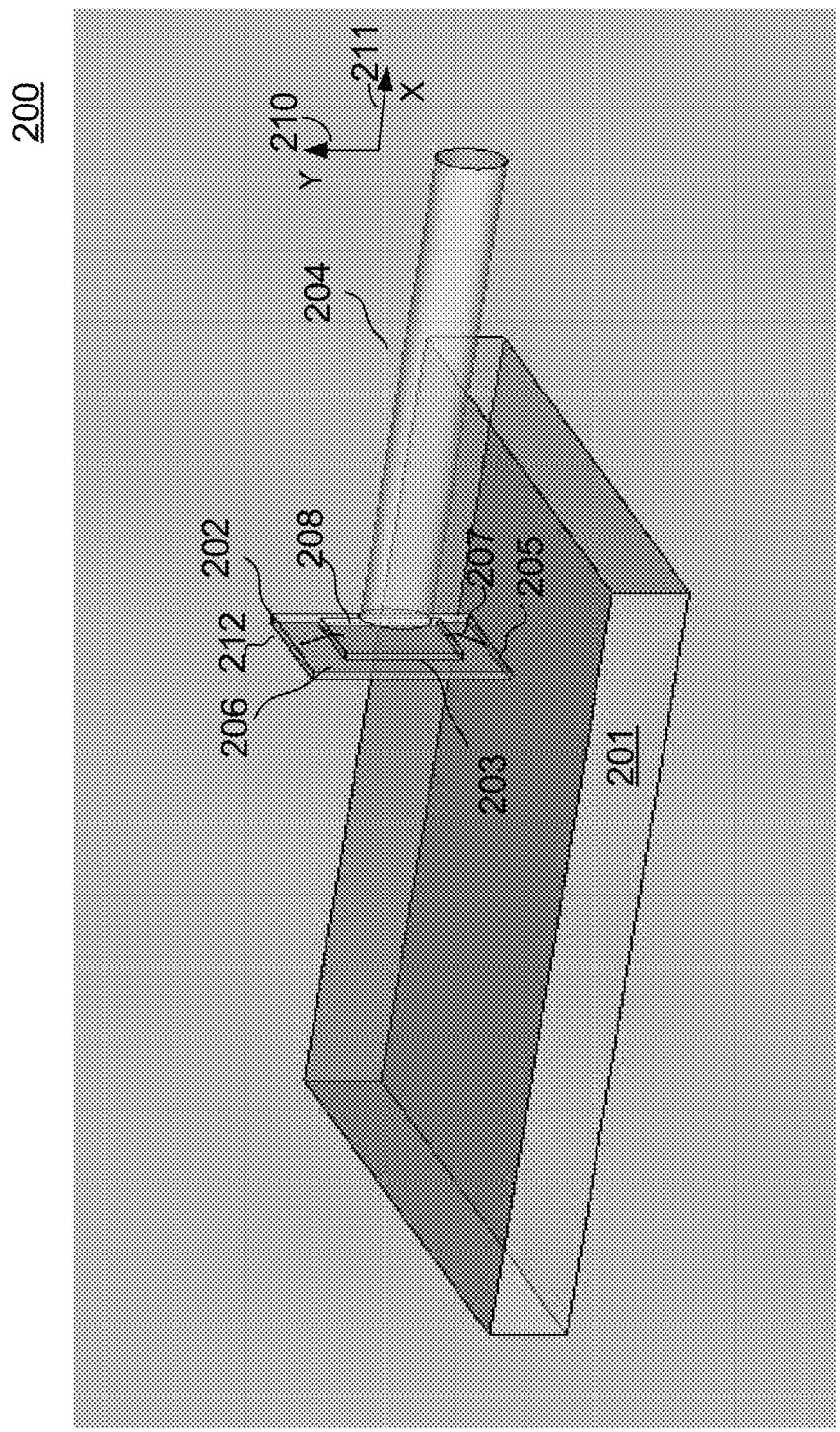
FIG. 2 is view of an optoelectronic device assembly to provide an electro-optical alignment according to one embodiment of the invention.

FIG. 2 is view of an optoelectronic device assembly to provide an electro-optical alignment according to one embodiment. An optoelectronic assembly 200 includes an electrical connector 207 on a micro sub-assembly substrate 202. Substrate 202 has a surface 206, a surface 212, and a side surface 205. Side surface 205 is adjacent to the surface 206 and surface 212. In one embodiment, surface 212 and surface 206 are opposing surfaces and are substantially parallel to each other. In one embodiment, the size of side surface 205 is substantially smaller than the size of the surface 206 of the substrate. In one embodiment, the side surface 205 of the substrate is about 1 mm to about 3 mm thick.

The electrical connector 207 extends along the substrate 202 onto the side surface to form a turn at a predetermined angle (not shown). An optoelectronic die 203 on the surface 206 of the micro sub-assembly substrate 202 is connected to the electrical connector 207. Optoelectronic die 203 has an optical surface 208 substantially parallel to the surface 206 of the substrate 202. As shown in FIG. 2, optoelectronic die 203 on the surface 206 of the micro sub-assembly substrate 202 is erected over a mounting board 201. In one embodiment, the micro sub-assembly substrate 202 is a printed circuit board substrate. Using the printed circuit board to provide electro-optical alignment as described herein provides an advantage of a low cost processing, easy defined shape, and a quick turnaround time. In one embodiment, mounting board 201 is a motherboard, a next-level integration board, or any other assembly mounting board. As shown in FIG. 2, side surface 205 of the erected substrate 202 is placed on top of the mounting board 201. Surface 206 and surface 212 are erected along an axis Y 210 substantially orthogonal to mounting board 201. In one embodiment, a portion of the electrical connector 207 is positioned between side surface 205 and mounting board 201. As shown in FIG. 2, optical surface 208 is optically coupled to a fiber 204 along an axis X 211 substantially parallel to the mounting board 211. In at least some embodiments, the fiber along the axis (e.g., axis X 211) being substantially parallel to a mounting board (e.g., mounting board 201) means that the axis extends in a same direction as the mounting board. In at least some embodiments, the fiber along the axis (e.g., axis X 211) being substantially parallel to a mounting board (e.g., mounting board 201) means that the axis does not meet with the mounting board. In at least some embodiments, an axis (e.g., axis X 211) being substantially parallel to a mounting board (e.g., mounting board 201) means that at least two points on the axis are at a similar distance from the mounting board. In at least some embodiments, the term "substantial parallelism" means that a small angle deviation of a position of a fiber from an axis parallel to a mounting board plane caused, for example, by fiber bending are acceptable within for example, the power loss constrain that the system design allows, the product lifetime reliability specification, and the manufacturing easiness with a given cost constraint. In at least some embodiments, an axis (e.g., axis X 211) being substantially parallel to a mounting board (e.g., mounting board 201) means that an angle between the reference axis and the axis of the mounting board is less than +/−45 degrees.

In one embodiment, the electrical connector 207 having a turn at a predetermined angle that extends to the side surface 205 of the micro sub-assembly substrate 202 replaces an optical path turn for coupling of the optoelectronic die, as described in further detail below. In at least some embodiments, the optoelectronic die includes a surface emitting device (e.g., VCSEL, other SE device), a photodetector (photodiode, other photodetector), or both. Typically, the surface-emitting device refers to a type of the device having a light emission substantially perpendicular to the top surface. Fiber 204 can be for example, a multimode fiber, a plastic optical fiber (POF), a glass optical fiber, a single mode fiber, or any other optical fiber. The optical fiber can have any core diameter. In at least some embodiments, the core diameter of the optical fiber is from about 500 microns ($\mu m$) to about 1 millimeter (mm). In at least some embodiments, the core diameter of the optical fiber is less than about 10 $\mu m$. In at least some embodiments, the core diameter of the optical fiber is from about 10 $\mu m$ to about 1 mm.

In at least some embodiments, a driver (not shown) is mounted on the printed circuit board substrate to drive the optoelectronic die. In at least some embodiments, the electrical connector having a turn that extends to the side surface of the printed circuit board substrate is configured to control an electrical impedance. In at least some embodiments, the printed circuit board (PCB) includes at least one of a FR-4, FR-2, a polyimide, and a teflon. In at least some embodiments, the printed circuit board includes a multilayer ceramic substrate.

The PCB substrate is used to mechanically support and electrically connect electronic components using conductive traces formed from conductive layers laminated onto a non-conductive substrate. The conducting layers are typically made of thin copper foil. Insulating layers dielectric are typically laminated together with epoxy resin prepreg. In one embodiment, the PCB substrate is coated with a solder mask. In at least some embodiments, the PCB substrate includes a dielectric, for example, polytetrafluoroethylene (Teflon), FR-4, FR-1, CEM-1 or CEM-3. Examples of prepreg materials that can be used in the PCB are FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Non-woven glass and epoxy), CEM-4 (Woven glass and epoxy), CEM-5 (Woven glass and polyester).

At least some embodiments described herein use a typical VCSEL bare die (chip) on a low cost carrier with mass produced added parts to allow a simple alignment of a multimode fiber or plastic optical fiber (POF) to couple the high bit rate optical data to a receiver forming a link. Typically, light is emitted from the VCSEL surface upward. In order to keep an electrical path for the VCSEL seamlessly interconnected within the assured high speed electrical signal integrity requirement when the VCSEL is finally assembled into the PCB, the traditional approach requires bending the path of the light emitted from the VCSEL. Bending the light path typically requires adding extra plastic or glass pieces that bend the light path by 90 degree through a sophisticated opto-mechanical design due to numerous constrains, such as a limited numerical aperture of fiber, an angle divergence of laser light, and other constrains. Even with well-designed opto-mechanical pieces, it creates added manufacturing process cost due to tight light path alignment process requirement, for example, premium precision charges.

Embodiments described herein avoid the optical assembly precision surcharges by using a fiber butt-coupling method (e.g., by bringing a fiber end close enough to an optical surface (e.g., optical surface 208) where most of the light is collected to the fiber (e.g., fiber 204) while keeping the link signal quality within the requirement. In butt-coupling, the lens is removed, and the fiber is collecting light directly from the optical surface of the light source. In one embodiment, the size of the optoelectronic chip is from about 500 microns ($\mu m$) to about 1 millimeter (mm), or other size. In one embodiment, the size of the optoelectronic chip is less than 500 microns ($\mu m$). In one embodiment, the size of the optical surface area of the optoelectronic chip (e.g., a light emitting area of the surface emitting device) is from about 10 $\mu m$ to about 20 $\mu m$ in diameter, or other size. In one embodiment, the size of the optical surface area of the optoelectronic chip is less than 10 $\mu m$. In one embodiment, the size of the optical surface area of the optoelectronic chip (e.g., a photosensitive receiving area of the photodector) is from about 60 $\mu m$ to about 100 $\mu m$ in diameter, or other size. In at least some embodiments, the size of the optical surface area of the optoelectronic chip is not less than the size of the core of the butt-coupling optical fiber.

The traditional approach is to bend the light path through a plastic or glass element by 90 degree through a light-pipe mechanical design. This creates redundant precision design and components which cause market barrier in terms of cost competitiveness.

The fiber butt-coupling method is impossible for the traditional approach that has an additional light-pipe length. In order to make 'butt-coupling' operable in a general PCB assembly process, the embodiments described herein show that an optoelectronic chip carrier (e.g., substrate 202) is flipped-up about 90 degree against the mounting board (e.g., board 201) to remove the additional light-pipe length (e.g., right angle turn) while keeping the assured electrical SI performance within a required level.

Embodiments described herein remove the major portion of cost adder, a prism like 90 degree light-pipe, by reconfiguring the mechanical architecture in order to handle an optical axis without using a high cost light-pipe. In an embodiment, by erecting the substrate (e.g., substrate 202), an optical axis (e.g., along axis X 211) forms a straight line from a transmitting optoelectronic device (e.g., VCSEL) surface (e., surface 208) (transmit end) to a fiber (e.g., fiber 204) and from a fiber (e.g., fiber 204) to a receiving optoelectronic device (e.g., photo-diode) surface (e.g., surface 208) at the far-end (receiver end). In at least some embodiments, to provide an electrical connection to the optoelectronic device mounted on the substrate erected substantially perpendicular to a mounting board (e.g., board 201), multiple electrodes are formed on the substrate edge (e.g., on a device mounting side near the edge, side surface near the edge). The multiple electrodes can be formed on the substrate edge using any of techniques known to one of ordinary skill in the art of electronic device manufacturing, e.g., a C-cutting, electroplating, package pins technique.

In at least some embodiments, an optoelectronic device (e.g., die 203) is mounted on the carrier (e.g., substrate 202) that has an electrical connection (e.g., a copper trace) extending onto the edge of the carrier (e.g., side surface 205). In at least some embodiments, the electrical connection includes at least one of a C-cut via, a bended pin, and a conductive line. In at least some embodiments, the electrical connection extending onto the edge of the carrier is formed using the surface mounting pin pads which are prepared on the edge of the carrier. In at least some embodiments, the electrical connection extending onto the edge of the carrier is formed using one of technologies known to one of ordinary skill in the art of electronic device manufacturing, for example, a C-cut an electro-plating, an electro-less plating, and a ceramic multilayer SMD technology.

At least some embodiments described herein replace an 'optical right angle turn" for a signal channel by an 'electrical right angle turn. This allows an electrical manufacturing process do more of the precision design and implementation instead of the optical manufacturing, which is more difficult to implement, expensive and bulky.

Figure 3A:
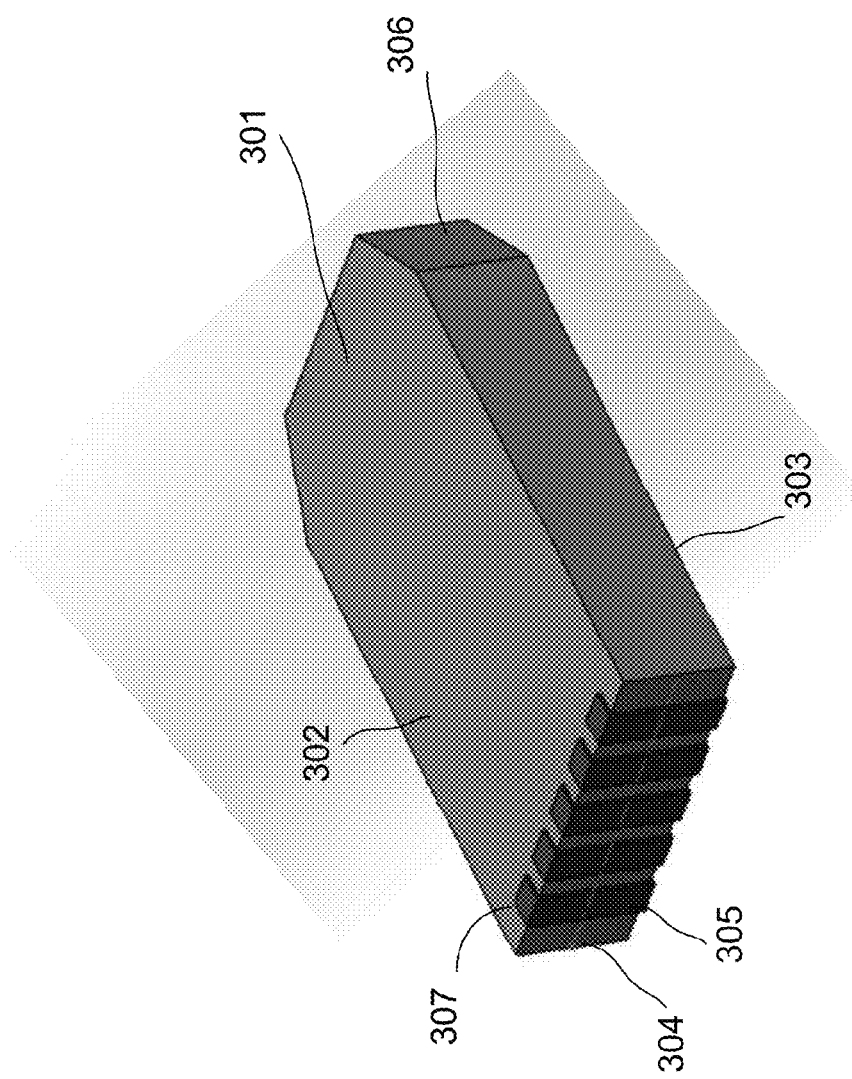
FIG. 3A illustrates a perspective view of a micro sub-assembly substrate according to one embodiment of the invention.

FIG. 3A illustrates a perspective view 300 of an exemplary embodiment of a micro sub-assembly substrate 301. Micro sub-assembly substrate 301 has a top surface 302, a bottom surface 303, and a side surface 304. In at least some embodiments, the micro sub-assembly substrate is a printed circuit board substrate. Electrical connectors, such as an electrical connector 305 are formed on substrate 301. Electrical connector 305 extends from surface 301 onto side surface 304. Electrical connector 305 forms a turn 307 at a corner between the side surface 304 and a surface 301. As shown in FIG. 3A, substrate 301 has a mating feature 306 to attach the micro-sub-assembly to a next level integration module, e.g., a lens holder, a fiber holder, or other sub-assembly. In one embodiment, mating feature 306 is a beveled corner of the substrate, although other mating features can be implemented. In one embodiment, the size of the side surface 304 is substantially smaller than the size of the top surface 302 of the substrate. In one embodiment, the side surface 304 of the substrate is about 1 mm to about 3 mm thick.

FIG. 3B1 shows a side view 310 of a finished micro sub-assembly substrate to form a micro sub-assembly according to one embodiment of the invention. A sub-assembly substrate 311 has a surface 321 and a surface 322 that are opposing surfaces and are substantially parallel to each other. A side surface 323 is between surfaces 321 and 322. In one embodiment, sub-assembly substrate 311 is a finished PCB substrate having electrical connectors, such as an electrical connector 312. Electrical connector 312 extends from the device mounting surface onto the side surface to form a turn (not shown) to replace an optical path turn for coupling of the optoelectronic die, as described herein. In at least some embodiments, forming the electrical connectors, such as electrical connector 312 includes at least one of a C-cutting, a pin bending, a electroplating, and a painting, as described in further detail below. In at least some embodiments, the micro sub-assembly substrate is a printed circuit board substrate, as described herein. In one embodiment, the size of the side surface 323 determined by the thickness of the substrate 311 is substantially smaller than the size of the surface 321 that is determined by the width of the substrate 311. For example, the thickness of the substrate 311 can be from about 1 mm to about 2 mm, or any other thickness. For example, the width of the substrate 311 can be from about 4 to about 6 mm, or any other width.

FIG. 3B2 is a view 340 similar to FIG. 3B 1 after an optoelectronic device 313 is placed onto a predefined place on the substrate according to one embodiment of the invention. In one embodiment, optoelectronic device 313 is an optoelectronic semiconductor die having an optical surface substantially parallel to the device mounting surface of the substrate, as described herein. In one embodiment, optoelectronic device 313 includes at least one of a surface emitting device, and a photodetector, as described herein. An electronic device 314 is placed on a predefined place on the substrate 311. In one embodiment, electronic device 312 is a driver of the optoelectronic device 313, a transimpedance amplifier (TIA), an integrated circuit, or any other passive or active electronic device. In one embodiment, a surface pad on a predetermined place on the substrate is formed to attach to the optoelectronic device 313. In one embodiment, the optoelectronic device can be attached to the substrate using any of techniques known to one of ordinary skill in the art, e.g., gluing, soldering, or a combination thereof.

FIG. 3B3 is a view 341 similar to FIG. 3B2 after a protection cover 315 is formed over the optoelectronic device according to one embodiment of the invention. In one embodiment, protection cover 315 is an optically transparent passivation layer. For example, the thickness of the protection cover can be from about 5 to about 6 mm, or can be any other thickness. In one embodiment, the passivation layer includes an optically transparent UV-curable epoxy resin. In one embodiment, the passivation layer includes a FH/LH material, for example, ULTEM (Polyetherimide), Polyimide, epoxy, and the like.

The optoelectronic device 313 is connected to an electrical connector, such as connector 312. In one embodiment, the optoelectronic die is connected to the electrical connector, such as connector 312 using a wire bonding technique. In one embodiment, the optoelectronic die is connected to the electrical connector, such as connector 312 using a flip chip bonding technique. Wire bonding and flip chip bonding techniques are known to one of ordinary skill in the art of electronic device manufacturing.

FIG. 3C is a view 320 similar to FIG. 3B3, after optoelectronic device 313 on the surface 321 of the sub-assembly substrate 311 is erected over a mounting board 324 according to one embodiment of the invention. As shown in FIG. 3C, side surface 323 of the substrate 311 is placed on the mounting board 324. Surface 321 and surface 322 are extended in a direction 390 away from the mounting board 324. In one embodiment, direction 390 is substantially orthogonal to the surface of the mounting board 324. A portion of electrical connector 312 is between the side surface 323 and board 324. A portion 316 of electrical connector 312 is on the surface 321. Electrical connector 312 has a turn at a predetermined angle 391 between these portions. In one embodiment, the electrical conductor turn's angle is a right (about 90 degrees) angle. In one embodiment, replacing of the optical path right angle turn by the electrical connector turn 391 is performed maintaining the signal integrity, as described herein. Optoelectronic device 313 is connected to portion 316 of the electrical connector by a wire 325, as shown in FIG. 3C.

Figure 3D:
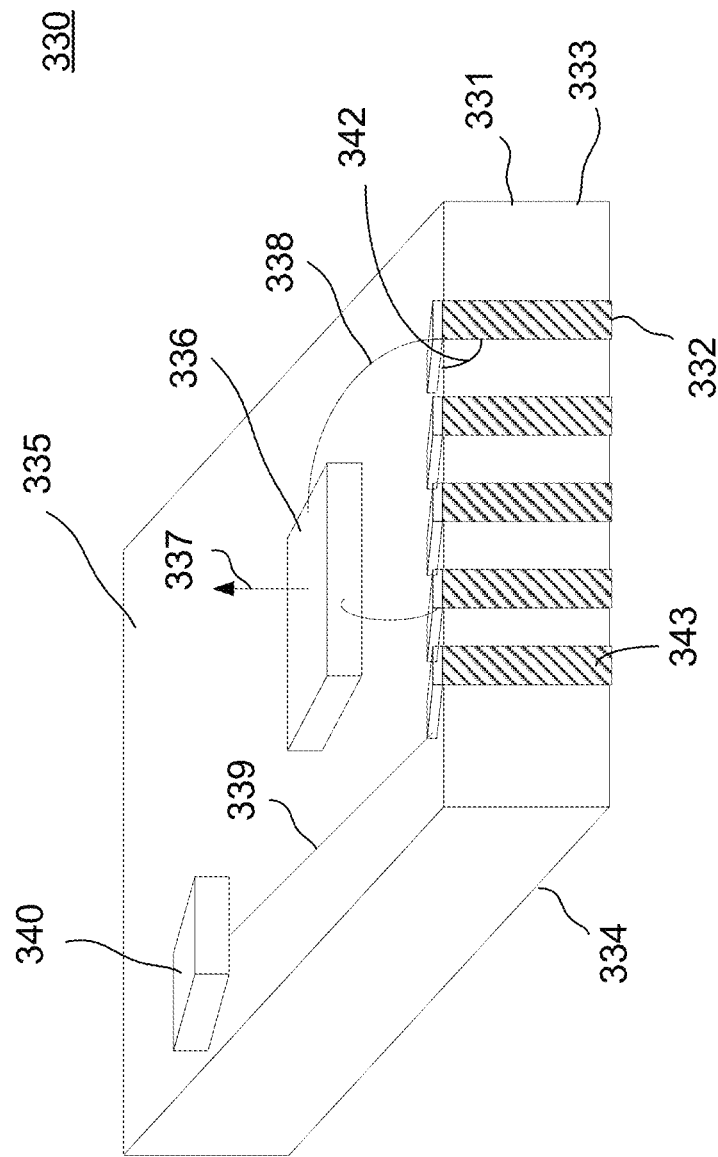
FIG. 3D is a perspective top view of a micro sub-assembly according to one embodiment of the invention.

FIG. 3D is a perspective top view 330 of a micro sub-assembly according to one embodiment of the invention. Electrical connectors, such as an electrical connector 332 is formed on a printed circuit board substrate 334. The electrical connectors extend from the surface 335 onto the side surface 333 of the substrate 331 to form a turn, such as a turn 342, as described herein. An optoelectronic die 336 placed on the surface 335 of the printed circuit board substrate 331 is directly connected to the electrical connector, such as connector 332 via an electrical connection 338 (e.g., a conductive wire). Optoelectronic die 337 has an optical axis 337 that is substantially perpendicular to the surface 335. An electronic device 340 (e.g., a driver, TIA, an integrated circuit, or any other passive or active electronic device) is placed on the substrate 311. Electronic device 340 is connected via an electrical connection 339 along the surface 335 to an edge electrical connector, such as connector 343. In one embodiment, the electrical connectors extending from the device mounting surface to the side surface of the substrate, such as electrical connectors 332 and 343 are pins formed on the device mounting surface 335 that are bended along the side surface 333. In one embodiment, the electrical connectors extending from the device mounting surface to the side surface of the substrate, such as electrical connectors 332 and 343 include conductive pads on the device mounting surface of the substrate directly connected to the electroplated conductive lines on the side surface of the substrate. In one embodiment, the electrical connectors extending from the device mounting surface to the side surface of the substrate, such as electrical connectors 332 and 343 are C-cut vias. In one embodiment, the electrical connector, such as electrical connector 332 is an impedance-controlled electrical line directly connected to the subassembly. That is, the electrical connector having the right angle turn directly connected to the subassembly as described herein maintains the impedance at a predetermined value, for example, 50 Ohm, 100 Ohm, or any other impedance value.

Figure 5B:
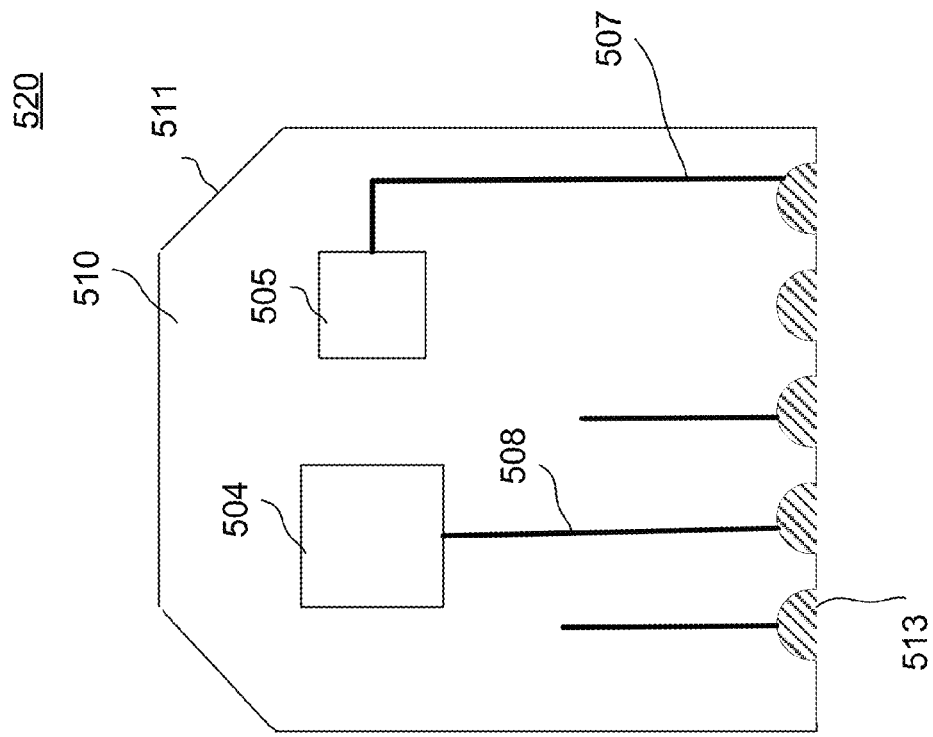
FIG. 5B is a view similar to FIG. 5A, after drill-cutting through the vias according to one embodiment of the invention.
Figure 5A:
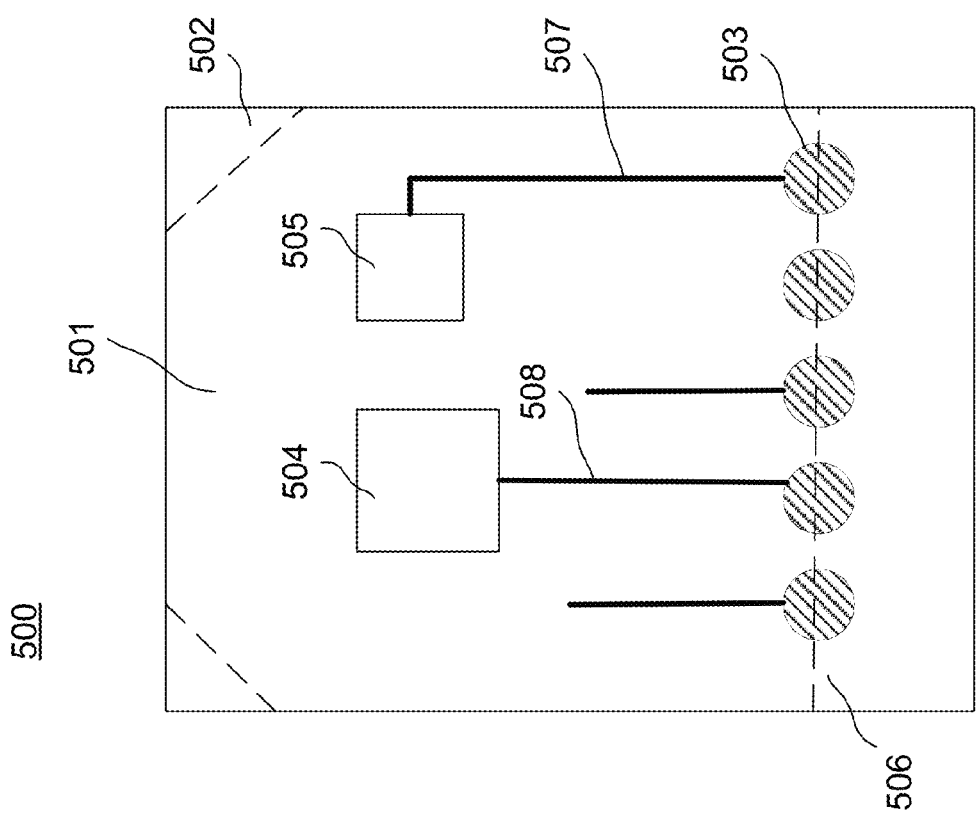
FIG. 5A is a top view of a micro sub-assembly substrate according to one embodiment of the invention.

FIG. 5A is a top view 500 of a micro sub-assembly substrate according to one embodiment of the invention. Conductive pads, such as a pad 504 and a pad 505 are formed on the sub-assembly substrate 501. In one embodiment, corners of the substrate 505 are cut at a dashed line 502 to form a mating feature. In one embodiment, the mating feature has a predetermined shape to mate with other sub-assembly module for a next level packaging, as described herein. Through hole vias, such as a via 503 are drilled in the substrate 501. In one embodiment, the vias are filled with a conductive material, e.g., copper, using one of techniques known to one of ordinary skill in the art of electronic device manufacturing. Conductive traces, such as a trace 507 and 508 are formed on the substrate 501 to connect to the filled vias and to the pads. In one embodiment, substrate 501 is drill-cut through the filled vias along a dashed line 503, using a C-cut technique known to one of ordinary skill in the art of electronic device manufacturing.

FIG. 5B is a view 520 similar to FIG. 5A, after drill-cutting through the vias according to one embodiment of the invention. As shown in FIG. 5B, the electrical connections extending from device mounting surface to the side surface of the substrate 501 comprising half (C-cut) filled conductive vias, such as a C-cut via 513 are formed. The C-cut vias, such as via 513 are used as electrical connectors to contact to a motherboard, a next-level integration board, or any other assembly mounting board. The C-cut vias, such as C-cut via 513 have a turn between the device mounting surface and the side surface of the board that replaces the optical path turn for the optoelectronic device, to make an optical axis of the next level integration substantially parallel to the optical axis of the optoelectronic device.

FIG. 3E shows a cross-sectional view 350 of a micro optical sub-assembly (MOSA) according to one embodiment of the invention. A sub-assembly substrate 351 has a top surface 351 and a bottom surface 352 that are substantially parallel to each other, as described herein. A through hole opening 355 is formed through substrate 351, as shown in FIG. 3E. An optoelectronic device 354 and an electronic device 356 as described herein are placed on the substrate 351. Optoelectronic device 354 is flipped onto the device mounting surface 353 to face opening 355. As shown in FIG. 3E, the optical surface 395 of the optoelectronic device faces an opening in the substrate. In one embodiment, the optoelectronic device 354 is flip-chip bonded onto the substrate 351 using one of flip-chip bonding techniques known to one of ordinary skill in the art.

FIG. 3F is a side view 360 similar to FIG. 3E, after the optoelectronic device 354 on the substrate 351 is erected over a mounting board 361 according to one embodiment of the invention. As shown in FIG. 3F, side surface 359 of the substrate 351 is placed on the mounting board 361. Optoelectronic device 354 is bonded via solder balls, e.g., a solder ball 362 to surface 353. As shown in FIG. 3E, surface 353 and surface 352 are extended in a direction away from the mounting board 361, as described herein. In one embodiment, the direction is substantially orthogonal to the surface of the mounting board 361, as described herein. The electrical connector to the optoelectronic device 354 has a portion 362 between the side surface 359 and board 361 and a portion on the surface 353. The electrical connector to the optoelectronic device has a turn at a predetermined angle formed by these portions, as described above. As shown in FIG. 3F, light propagates through opening 355 along an optical axis 357 of the optical surface of the optoelectronic device. The optoelectronic device 354 can be any of the optoelectronic devices described herein.

Figure 3G:
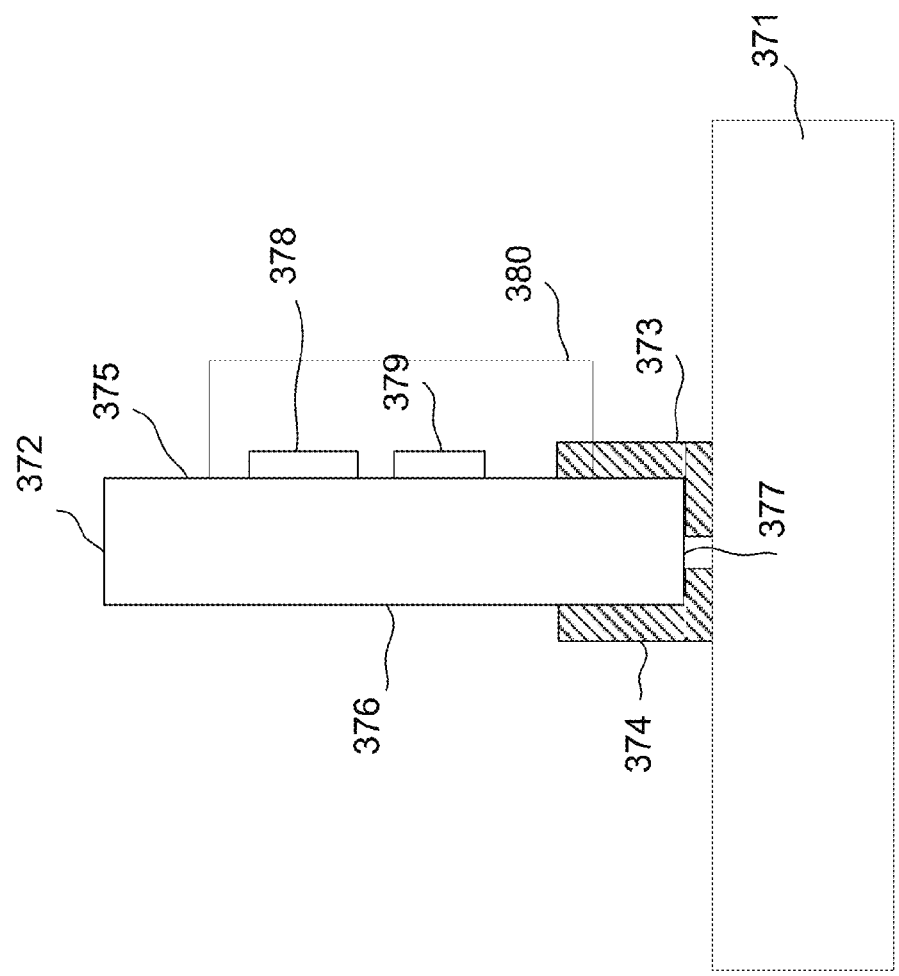
FIG. 3G is a side view showing a Micro-optical sub-assembly (MOSA) erected over a mounting board according to one embodiment of the invention.

FIG. 3G is a side view 370 showing a MOSA 376 erected over a mounting board 371 according to one embodiment of the invention. As shown in FIG. 3G, side surface 377 of a sub-assembly substrate 372 is placed on the mounting board 361. An optoelectronic device 378 and an electronic device 379 are mounted on a surface 375 of the substrate 372, as described above. As shown in FIG. 3G, a surface 375 and an opposing surface 396 of substrate 372 are extended in a direction away from the mounting board 371, as described above. In one embodiment, the direction is substantially orthogonal to the surface of the mounting board 371, as described above. A protection cover 380 is formed over the devices 378 and 379, as described above. MOSA 376 has an electrical connector 373 to device 379 and an electrical connector 374 on surface 396. Electrical connector 373 turns from the side surface 377 to the surface 375 to provide electro-optical alignment, as described above. Electrical connector 374 turns from the side surface 377 to the surface 376 to provide an electrical connection to an opposing surface 376. The devices 378 and 378 can be any of the optoelectronic devices described herein.

Figure 4:
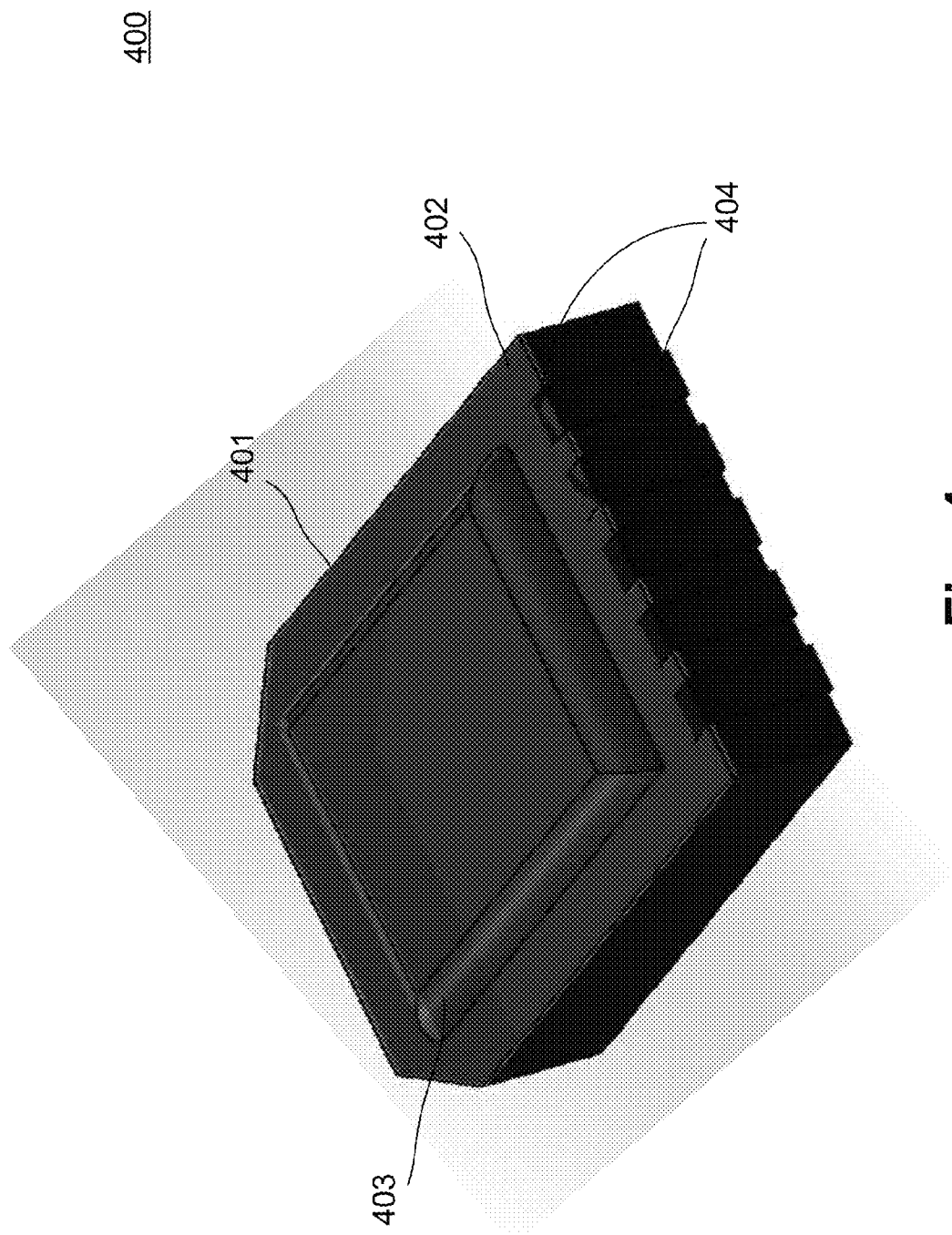
FIG. 4 is a perspective top view of a MOSA according to one embodiment of the invention.

FIG. 4 is a perspective top view of a micro sub-assembly (MOSA) according to one embodiment of the invention. A MOSA 400 includes an optoelectronic device (not shown) on a substrate 402, and a protection cover 403, as described herein. Impedance controlled electrical connectors having a right angle turn from the device mounting surface to the side surface of the substrate 402, such as an electrical connector 404 are formed on the substrate to avoid an optical path right angle turn for the optoelectronic device, as described herein. The electrical connectors, such as electrical connector 404 are soldered to a mounting board for a next level integration assembly, as described in further detail below.

Figure 6:
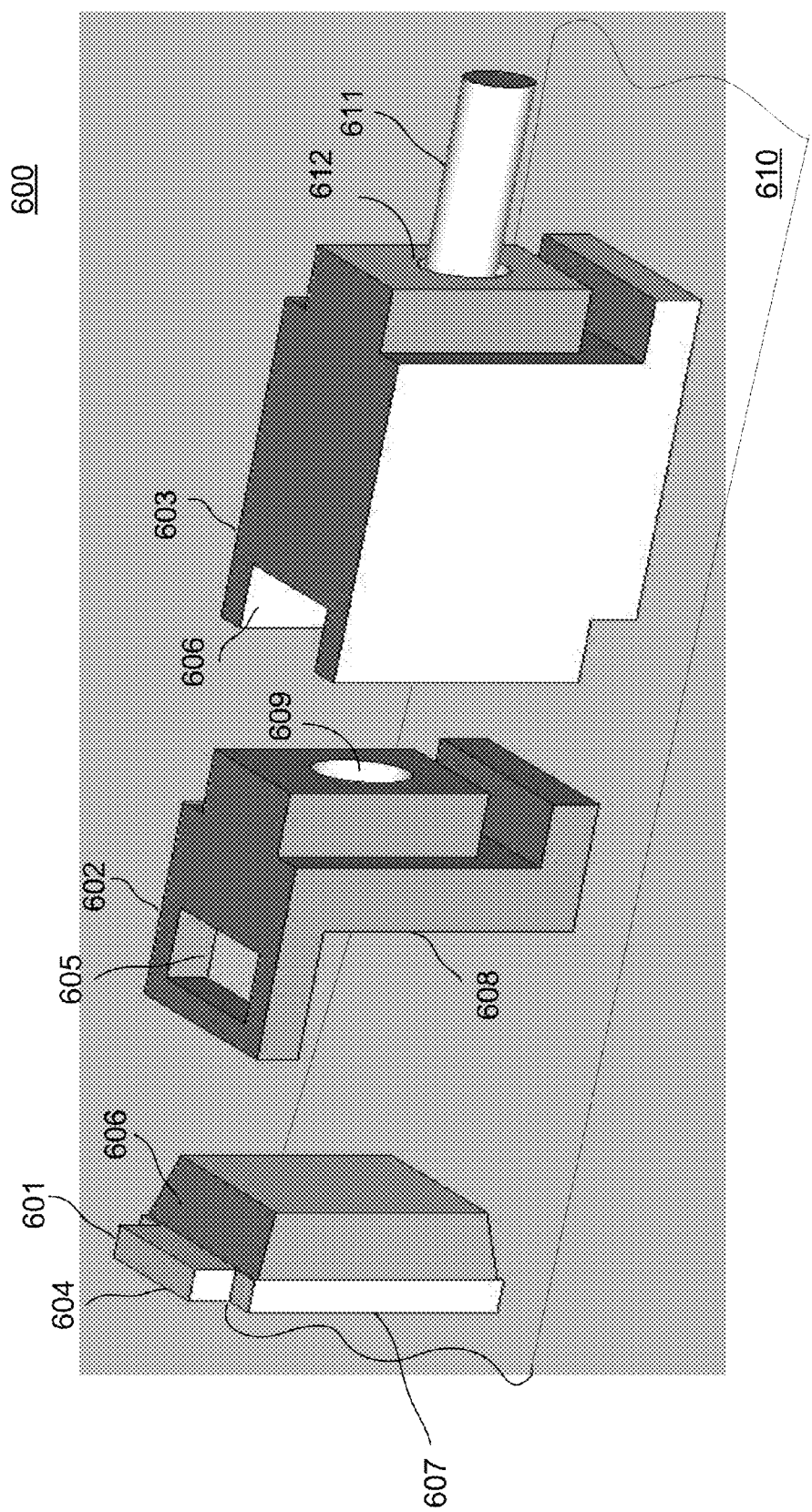
FIG. 6 is a perspective view of sub-assemblies according to one embodiment of the invention.

FIG. 6 is a perspective view 600 of sub-assemblies according to one embodiment of the invention. As shown in FIG. 6, a micro sub-assembly (MOSA) 601 comprises a protection cover 606 over an optoelectronic device on a substrate 601 to be erected on a mounting board 610, as described above. MOSA 601 has electrodes connected to the optoelectronic device that have a turn to solder to the mounting board, as described above. MOSA 601 can be any of the MOSAs as described herein. MOSA 601 has a mating feature 604 to mate to a mating feature of other sub-assembly, e.g., a mating feature of a sub-assembly 602. In one embodiment, the mating feature of the sub-assembly 602 includes an opening 605 to receive feature 604. As shown in FIG. 6, protection cover 606 is configured to be attached to a wall 608 of sub-assembly 602. In one embodiment, sub-assembly 602 having an opening 609 to optically couple MOSA 601 to a sub-assembly 603 (e.g., a fiber holder) acts as a supporting member to the erected substrate 607. In one embodiment, sub-assembly 602 is a lens holder. Sub-assembly 603 has an opening 612 to hold an optical fiber 611 and a mating feature 606 to mate with other sub-assembly, e.g., sub-assembly 602. Fiber 611 can be for example, a multimode fiber, a plastic optical fiber (POF), a glass optical fiber, a single mode fiber, or any other optical fiber. The core diameter of the optical fiber can be, for example, from about 500 microns to about 1 millimeter, or other core diameter.

Figure 7:
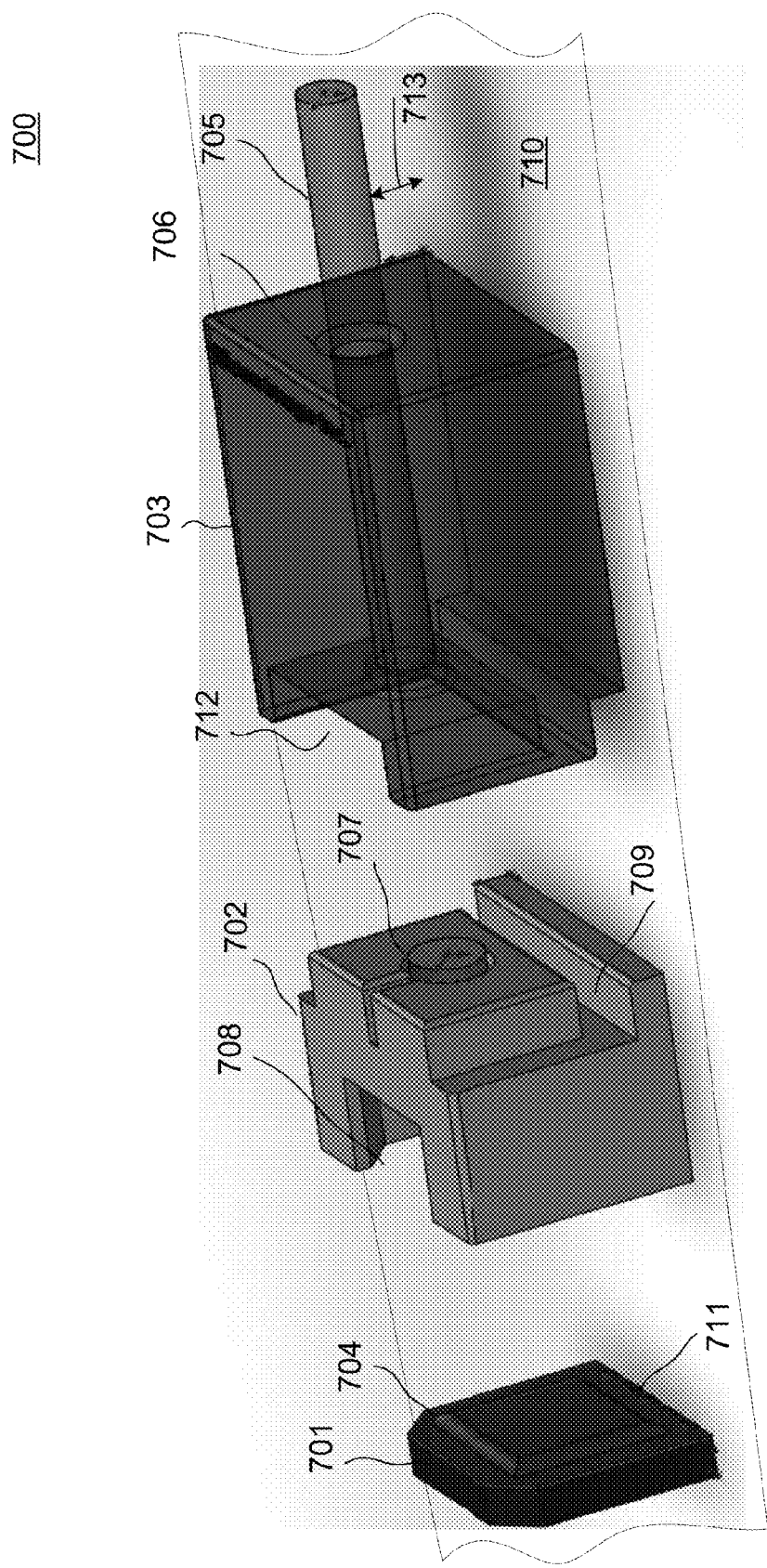
FIG. 7 is a perspective view of sub-assemblies according to one embodiment of the invention.

FIG. 7 is a perspective view 700 of sub-assemblies according to one embodiment of the invention. As shown in FIG. 7, a micro sub-assembly (MOSA) 701 comprises a protection cover over an optoelectronic device on a substrate to be erected on a mounting board 710, as described above. MOSA 701 has electrodes, such as an electrode 711 connected to the optoelectronic device that have a turn to solder to the mounting board, as described above. MOSA 701 can be any of the MOSAs as described herein. MOSA 701 has a cut corner 704 to mate to a mating feature of other sub-assembly, e.g., a mating feature 708 of a sub-assembly 702, as described above. In one embodiment, sub-assembly 702 having an opening 707 to optically couple MOSA 701 to a sub-assembly 703 (e.g., fiber holder) acts as a supporting member to the erected substrate of the MOSA 701. In one embodiment, sub-assembly 702 is a lens holder. Fiber holder 703 has an opening 706 to hold an optical fiber 705 and a mating feature 712 to mate with other sub-assembly, e.g., a mating feature 709 of sub-assembly 702. In one embodiment, a center of the optical surface of the optoelectronic device on the erected substrate 701, a center of the opening 707, and a center of the opening 706 are maintained at a predetermined height from mounting board 710, e.g. a height 713 to butt couple the fiber 705 with the optoelectronic device erected on the substrate 701. Fiber 705 can be for example, a multimode fiber, a plastic optical fiber (POF), a glass optical fiber, a single mode fiber, or any other optical fiber. The core diameter of the optical fiber can be, for example, from about 500 microns to about 1 millimeter, or other core diameter.

Figure 8A:
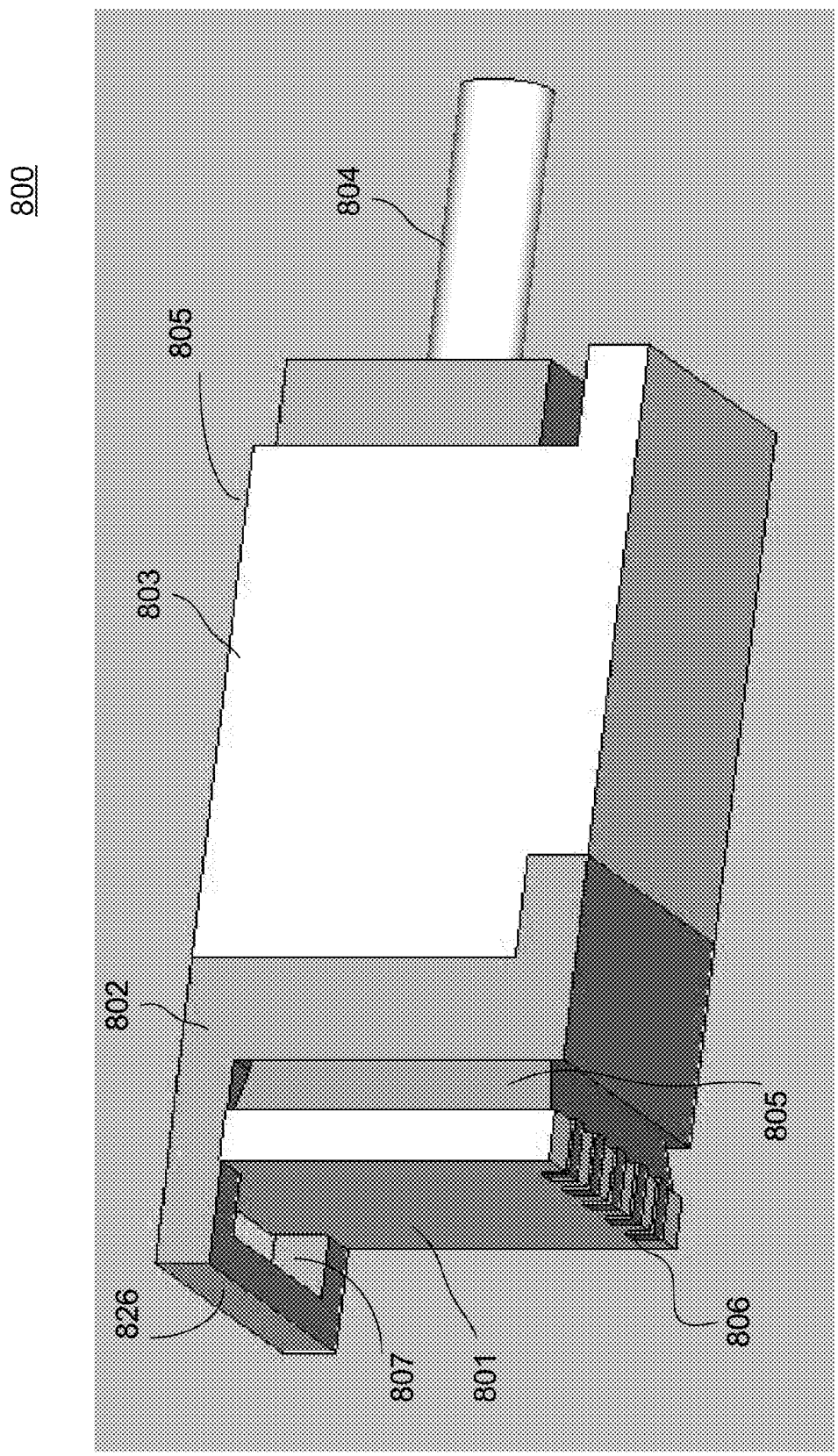
FIG. 8A is a perspective bottom view of an assembly according to one embodiment of the invention.

FIG. 8A is a perspective bottom view 800 of an assembly according to one embodiment of the invention. An assembly 805 includes a MOSA 801 attached to a sub-assembly 802. Sub-assembly 802 acts as a supporting member for the erected substrate of the MOSA 801, as described above. MOSA 801 is attached to sub-assembly 802 by mating feature 807 which is inserted into an opening of mating feature 826 of sub-assembly 802. MOSA 801 has electrical connectors on a printed circuit substrate, such as an electrical connector 806 to directly connect to a mounting board of a next level assembly, as described above. MOSA 801 has a cover 805 over an optoelectronic device on the printed circuit substrate to attach to sub-assembly 802, as described above. Sub-assembly 802 (e.g., a lens holder) is attached to a sub-assembly 803 via the mounting feature, as described above. In one embodiment, sub-assembly 803 holds a fiber 804. Fiber 804 can be for example, a multimode fiber, a plastic optical fiber (POF), a glass optical fiber, a single mode fiber, or any other optical fiber. The core diameter of the optical fiber can be, for example, from about 500 microns to about 1 millimeter, or other core diameter.

FIG. 8B is a perspective top view 820 of an assembly 805 of FIG. 8A on a mounting board according to one embodiment of the invention. As shown in FIG. 8B, MOSA 801 supported by sub-assembly 802 (e.g., a lens holder) is attached to a sub-assembly 803 (e.g., a fiber holder), as described above. The assembly 805 is mounted on a mounting surface 810. Assembly 805 provides an electro-optical alignment according to embodiments described herein. In one embodiment, assembly 805 attached to a mounting surface 810 is part of an active optical cable, a TV monitor, or any other optoelectronic device assembly.

Figure 9:
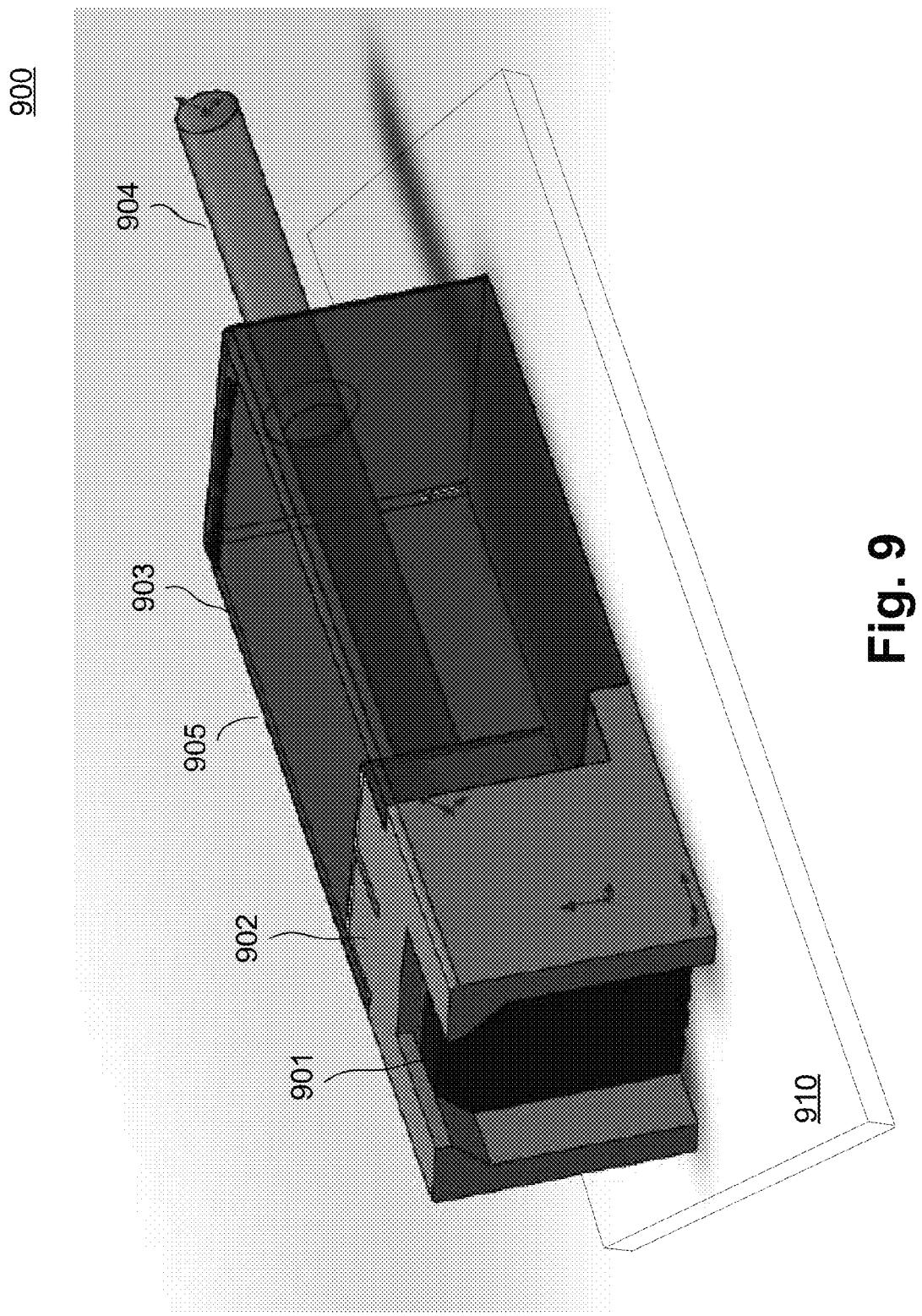
FIG. 9 is a perspective top view of an assembly on a mounting board according to one embodiment of the invention.

FIG. 9 is a perspective top view 900 of an assembly 905 on a mounting board 920 according to one embodiment of the invention. As shown in FIG. 9, assembly 905 comprises sub-assemblies 901, 902, and 903 having mating features similar to the corresponding mating features of the sub-assemblies 701, 702, and 703 of FIG. 7. MOSA 901 supported by sub-assembly 902 (e.g., a lens holder) is attached to a sub-assembly 903 via corresponding mating features, as described above. In one embodiment, sub-assembly 903 holds a fiber 904. Fiber 904 can be any of fibers, as described above. The assembly 905 is mounted on a mounting surface 910. In one embodiment, assembly 905 on mounting surface 910 is part of an active optical cable, a TV monitor, or any other optoelectronic device assembly.

Figure 10:
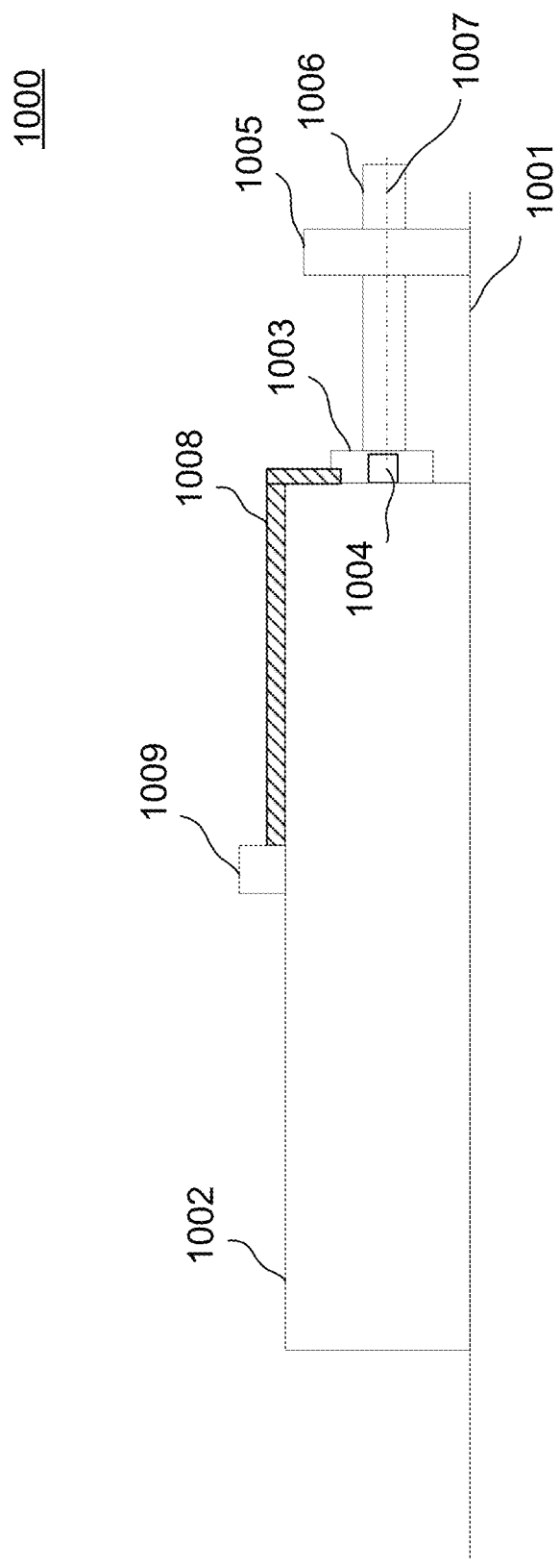
FIG. 10 is a cross-sectional view of a micro-optical sub-assembly according to one embodiment of the invention.

FIG. 10 is a cross-sectional view 1000 of a micro-optical sub-assembly according to one embodiment of the invention. An optoelectronic device 1004 (e.g., surface emitting device, a photodetector) is attached to a side surface of a printed circuit board substrate 1002. As shown in FIG. 10, printed circuit board substrate 1002 is positioned on a mounting board 1001. Printed circuit board substrate 1002 can be any of the substrates described herein. Mounting board 1001 can be any of mounting boards described herein. A protection cover 1003 as described herein covers device 1004. An electrical connection 1008 extends from the side surface of the substrate 1002 to a top surface of the substrate 1009 forming a turn at a predetermined angle (e.g. about 90 degrees) to provide butt coupling of a fiber 1006 along optical axis 1007 without using a lens. In one embodiment, the side surface is substantially smaller than the top surface of the substrate. In one embodiment, the side surface of the substrate is about 1 mm to about 3 mm thick.

Figure 11:
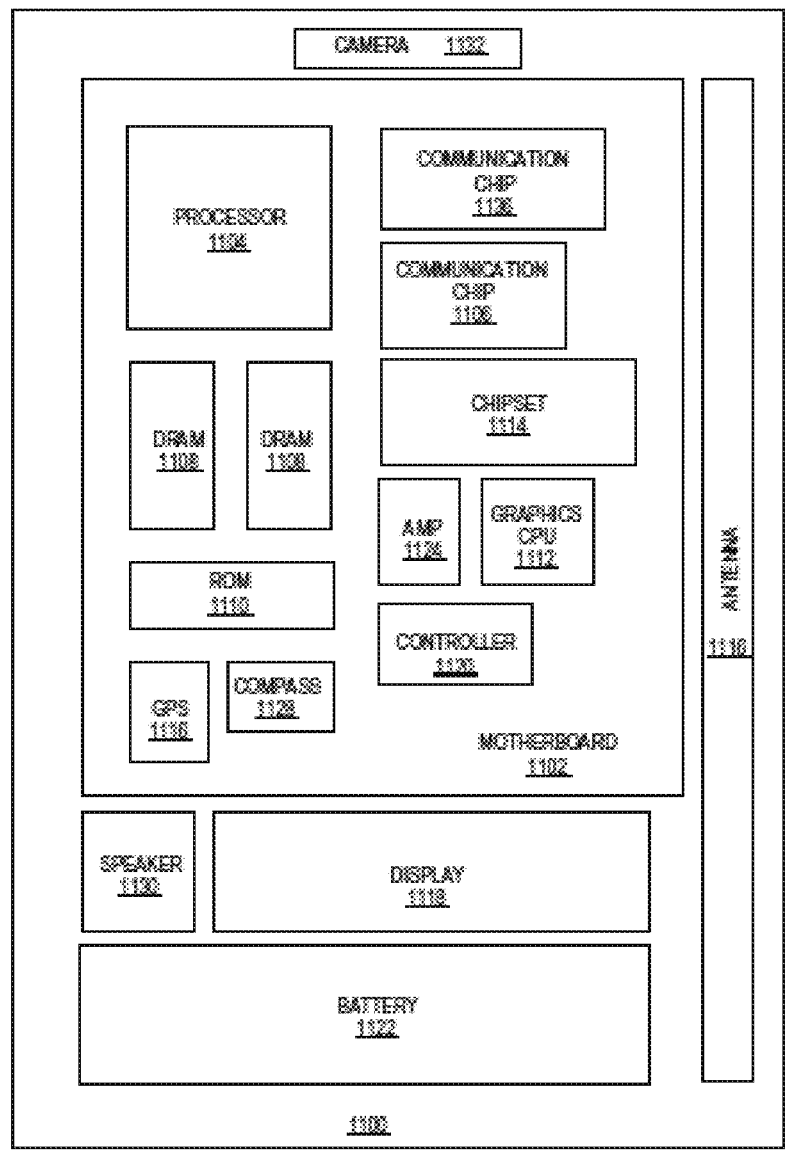
FIG. 11 illustrates a data processing system according to one embodiment of the invention.

FIG. 11 illustrates a data processing system 1100 according to one embodiment of the invention. The data processing system 1100 houses a board 1102. The board 1102 may include a number of components comprising an optoelectronic assembly to provide an electro-optical alignment according to embodiments described herein. A processor 1104 is physically and electrically coupled to the board 1102. In some implementations at least one communication chip is also physically and electrically coupled to the board 1102. In further implementations, at least one communication chip 1106 is part of the processor 1104.

Depending on its application, data processing system 1100 may include other components that may or may not be physically and electrically coupled to the board 1102. These other components include, but are not limited to, a memory, such as a volatile memory 1108 (e.g., a DRAM), a non-volatile memory 1110 (e.g., ROM), a flash memory, a graphics processor 1112, a digital signal processor (not shown), a crypto processor (not shown), a chipset 1114, an antenna 1116, a display 1118, e.g., a touchscreen display, a display controller 1120, e.g., a touchscreen controller, a battery 1122, an audio codec (not shown), a video codec (not shown), an amplifier, e.g., a power amplifier 1124, a global positioning system (GPS) device 1126, a compass 1128, an accelerometer (not shown), a gyroscope (not shown), a speaker 1130, a camera 1132, and a mass storage device (such as hard disk drive, compact disk (CD), digital versatile disk (DVD), and so forth) (not shown).

A communication chip, e.g., communication chip 1106, enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The data processing system 1100 may include a plurality of communication chips, e.g., a communication chip 1106 and a communication chip 1136.

In at least some embodiments, the processor 1104 of the data processing system 1100 includes an assembly to provide an electro-optical alignment according to embodiments described herein. The integrated circuit die of the processor includes one or more devices, such as transistors or metal interconnects as described herein. The term "processor" may refer to any device or portion of a device that processes electronic data from registers and/or memory to transform that electronic data into other electronic data that may be stored in registers and/or memory.

A display 1118 can include an assembly to provide an electro-optical alignment according to the embodiments described herein. In further implementations, another component housed within the system 1100 may contain an assembly to provide an electro-optical alignment according to embodiments described herein.

In accordance with one implementation, the integrated circuit die of the communication chip includes one or more devices, such as transistors and metal interconnects, as described herein. In various implementations, the data processing system 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the data processing system 1100 may be any other electronic device that processes data.

In the foregoing specification, embodiments of the invention have been described with reference to specific exemplary embodiments thereof. It will be evident that various modifications may be made thereto without departing from the broader spirit and scope of the embodiments of the invention. The specification and drawings are, accordingly, to be regarded in an illustrative sense rather than a restrictive sense.

What is claimed is:

1. An optoelectronic assembly to provide an electro-optical alignment, comprising:
a printed circuit board substrate comprising:
 a front surface,
 a rear surface at an opposite side of the front surface of the printed circuit board substrate and parallel to the front surface,
 a bottom surface extending from the front surface to the rear surface, wherein the bottom surface in conjunction with the front surface and the rear surface forming an outer periphery of the printed circuit board substrate, the bottom surface substantially perpendicular to the front surface and the rear surface,
 a first electrical connector for connecting to a first conductive line on a mounting board, the first electrical connector formed on the printed circuit board substrate to extend at least partially along the front surface and the bottom surface,
 a second electrical connector for connecting to a second conductive line on the mounting board, the second electrical connector formed on the printed circuit board substrate to extend at least partially along the bottom surface and the rear surface, the printed circuit board substrate configured to be secured to the mounting board with a portion of the first electrical connector and a portion of the second electrical connector on the bottom surface parallel to a mounting surface of the mounting board; and
an optoelectronic die on the front surface of the printed circuit board substrate and electrically coupled to the first electrical connector, the optoelectronic die comprising an optical surface substantially parallel to the front surface,
wherein the printed circuit board substrate has a first mating feature, the first mating feature patterned on a top surface of the printed circuit board substrate, the top surface substantially parallel to the bottom surface and substantially perpendicular to the front surface, and a supporting member having a second mating feature and a third mating feature, wherein the supporting member is coupled to the printed circuit board substrate by mating the first mating feature with the second mating feature, and wherein the supporting member is coupled to a fiber holder by mating the third mating feature with a fourth mating feature, the fourth mating feature patterned on a rear surface of the fiber holder.

2. The assembly of claim 1, wherein the fiber holder is configured to hold a fiber substantially parallel to the mounting surface of the mounting board.

3. The assembly of claim 1, wherein the printed circuit board substrate is secured to the mounting board with the bottom surface facing the mounting surface of the mounting board.

4. The assembly of claim 1, wherein the second mating feature is patterned on a top surface of the supporting member and the third mating feature is patterned on a front surface of the supporting member, the top surface of the supporting member substantially perpendicular to the front surface of the supporting member.

5. The assembly of claim 4, wherein the fiber holder has a fifth mating feature, the fifth mating feature patterned on a front surface of the fiber holder, the front surface of the fiber holder substantially parallel to the rear surface of the fiber holder.

6. The assembly of claim 5, further comprising:
a fiber configured to provide optical input to the printed circuit board substrate, the fiber passing through a first opening in the fiber holder and through a second opening in the supporting member.

7. The assembly of claim 6, wherein each of the first opening and the second opening is formed in a direction substantially parallel to the mounting surface of the mounting board, the first opening extending from the front surface of the fiber holder to the rear surface of the fiber holder and the second opening extending from the front surface of the supporting member to a rear surface of the supporting member.

8. An optoelectronic assembly to provide an electro-optical alignment, comprising,
a printed circuit board substrate comprising:
   a front surface,
   a rear surface at an opposite side of the front surface of the printed circuit board substrate and parallel to the front surface,
   a bottom surface extending from the front surface to the rear surface, wherein the bottom surface in conjunction with the front surface and the rear surface forming an outer periphery of the printed circuit board substrate, the bottom surface substantially perpendicular to the front surface and the rear surface,
   a first electrical connector for connecting to a first conductive line on a mounting board, the first electrical connector formed on the printed circuit board substrate to extend at least partially along the front surface and the bottom surface,
   a second electrical connector for connecting to a second conductive line on the mounting board, the second electrical connector formed on the printed circuit board substrate to extend at least partially along the bottom surface and the rear surface, the printed circuit board substrate configured to be secured to the mounting board with a portion of the first electrical connector and a portion of the second electrical connector on the bottom surface parallel to a mounting surface of the mounting board; and
an optoelectronic die on the front surface of the printed circuit board substrate and electrically coupled to the first electrical connector, the optoelectronic die comprising an optical surface substantially parallel to the front surface,
wherein the first electrical connector comprises a first electrical path on the bottom surface, the first electrical path filled with a conductive material and extending from the front surface to the rear surface, and wherein the second electrical connector comprises a second electrical path on the bottom surface, the second electrical path filled with a conductive material and extending from the rear surface to the front surface.

9. A printed circuit board substrate comprising:
a front surface;
a rear surface at an opposite side of the front surface and parallel to the front surface;
a bottom surface extending from the front surface to the rear surface, wherein the bottom surface in conjunction with the front surface and the rear surface forming an outer periphery of the printed circuit board substrate, the bottom surface substantially perpendicular to the front surface and the rear surface;
a first electrical connector for connecting to a first conductive line on a mounting board, the first electrical connector formed on the printed circuit board substrate to extend at least partially along the front surface and the bottom surface, the printed circuit board substrate configured to be secured to the mounting board with a portion of the first electrical connector on the bottom surface parallel to a mounting surface of the mounting board; and
an optoelectronic die placed on the front surface of the printed circuit board substrate and electrically coupled to the first electrical connector, the optoelectronic die comprising an optical surface substantially parallel to the front surface,
wherein the printed circuit board substrate has a first mating feature, the first mating feature patterned on a top surface of the printed circuit board substrate, the top surface substantially parallel to the bottom surface and substantially perpendicular to the front surface, and a supporting member having a second mating feature and a third mating feature, wherein the supporting member is coupled to the printed circuit board substrate by mating the first mating feature with the second mating feature, and wherein the supporting member is coupled to a fiber holder by mating the third mating feature with a fourth mating feature, the fourth mating feature patterned on a rear surface of the fiber holder.

10. The printed circuit board substrate of claim 9, further comprising:
a second electrical connector for connecting to a second conductive line on the mounting board, the second electrical connector formed on the printed circuit board substrate to extend at least partially along the bottom surface and the rear surface.

11. The printed circuit board substrate of claim 10, wherein the printed circuit board substrate is further configured to be secured to the mounting board with a portion of the second electrical connector on the bottom surface parallel to the mounting surface of the mounting board.

12. The printed circuit board substrate of claim 9, wherein the fiber holder is configured to hold a fiber substantially parallel to the mounting surface of the mounting board.

13. The printed circuit board substrate of claim 9, wherein the printed circuit board substrate is secured to the mounting board with the bottom surface facing the mounting surface of the mounting board.

14. The printed circuit board substrate of claim 9, wherein the first electrical connector comprises a first electrical path on the bottom surface, the first electrical path filled with a conductive material and extending from the front surface to the rear surface, and wherein the second electrical connector comprises a second electrical path on the bottom surface, the second electrical path filled with a conductive material and extending from the rear surface to the front surface.

15. The printed circuit board substrate of claim 9, wherein the second mating feature is patterned on a top surface of the supporting member and the third mating feature is patterned on a front surface of the supporting member, the top surface of the supporting member substantially perpendicular to the front surface of the supporting member.

16. The printed circuit board substrate of claim 15, wherein the fiber holder has a fifth mating feature, the fifth mating feature patterned on a front surface of the fiber holder, the front surface of the fiber holder substantially parallel to the rear surface of the fiber holder.

17. The printed circuit board substrate of claim 16, further comprising:
a fiber configured to provide optical input to the printed circuit board substrate, the fiber passing through a first opening in the fiber holder and through a second opening in the supporting member.

18. The printed circuit board substrate of claim 17, wherein each of the first opening and the second opening is formed in a direction substantially parallel to the mounting surface of the mounting board, the first opening extending from the front surface of the fiber holder to the rear surface of the fiber holder and the second opening extending from the front surface of the supporting member to a rear surface of the supporting member.

19. The printed circuit board substrate of claim 9, wherein each of the first electrical connector and the second electrical connector is configured to control its electrical impedance at a predetermined value.

20. The printed circuit board substrate of claim 9, wherein the printed circuit board substrate includes material from at least one of a FR-4, FR-2, a polyimide, and a Teflon material.

* * * * *